(12) United States Patent
Kezobo et al.

(10) Patent No.: US 8,232,752 B2
(45) Date of Patent: Jul. 31, 2012

(54) ELECTRIC MOTOR CONTROL APPARATUS

(75) Inventors: Isao Kezobo, Tokyo (JP); Masahiro Kimata, Tokyo (JP); Takayuki Kifuku, Tokyo (JP); Kazumichi Tsutsumi, Tokyo (JP); Chiaki Fujimoto, Tokyo (JP); Noriyuki Inoue, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 563 days.

(21) Appl. No.: 12/520,995

(22) PCT Filed: Apr. 16, 2007

(86) PCT No.: PCT/JP2007/058278
§ 371 (c)(1),
(2), (4) Date: Jun. 24, 2009

(87) PCT Pub. No.: WO2008/129658
PCT Pub. Date: Oct. 30, 2008

(65) Prior Publication Data
US 2010/0060222 A1    Mar. 11, 2010

(51) Int. Cl.
*H02P 6/06* (2006.01)
(52) U.S. Cl. ......... 318/400.06; 318/400.01; 318/400.04; 318/490; 318/700
(58) Field of Classification Search ............ 318/400.01, 318/400.04, 400.06, 490, 700
See application file for complete search history.

(56) References Cited

U.S. PATENT DOCUMENTS

| | | | | |
|---|---|---|---|---|
| 4,869,333 A * | 9/1989 | Morishita et al. | ............. | 180/404 |
| 5,506,776 A * | 4/1996 | Fushimi et al. | ................ | 701/41 |
| 5,550,697 A * | 8/1996 | Green et al. | ................... | 361/18 |
| 5,874,818 A * | 2/1999 | Schuurman | .............. | 318/400.04 |
| 6,153,993 A * | 11/2000 | Oomura et al. | ............... | 318/434 |
| 6,683,435 B1 * | 1/2004 | Liang et al. | .................. | 318/727 |
| 6,729,435 B2 * | 5/2004 | Yamada et al. | ............... | 180/446 |
| 6,906,492 B2 * | 6/2005 | Matsushita | ................... | 318/727 |
| 7,161,323 B2 | 1/2007 | Ajima et al. | | |

(Continued)

FOREIGN PATENT DOCUMENTS

JP    6 22446    1/1994

(Continued)

OTHER PUBLICATIONS

Office Action issued Jun. 7, 2011, in Japan Patent Application No. 2009-510692.

*Primary Examiner* — Bentsu Ro
*Assistant Examiner* — Kawing Chan
(74) *Attorney, Agent, or Firm* — Oblon, Spivak, McClelland, Maier & Neustadt, L.L.P.

(57) ABSTRACT

An electric motor control apparatus that can quickly and accurately locate a short-circuit fault point. The electric motor control apparatus includes: a current controller determining respective phase voltage commands according to currents flowing in respective phases of an electric motor and a torque current command; a switching element drive circuit instructing, based on the respective phase voltage commands, an inverter to perform a switching operation; the inverter receiving a switching operation signal to drive the electric motor; current detectors disposed in series with the switching elements in the respective phases of the inverter; and a short-circuit point locating mechanism storing a test pattern indicative of a predetermined combination for turning on the switching elements of the inverter, and locating a short-circuit fault point based on the test pattern and current detection values in the respective phases detected by the current detectors in response to the test pattern.

6 Claims, 14 Drawing Sheets

U.S. PATENT DOCUMENTS

| | | |
|---|---|---|
| 2005/0093505 A1* | 5/2005 | Kameya .................. 318/805 |
| 2006/0001392 A1* | 1/2006 | Ajima et al. ............. 318/432 |
| 2006/0091840 A1* | 5/2006 | Weinmann ............... 318/434 |
| 2007/0035272 A1* | 2/2007 | Hattori et al. ............ 318/823 |
| 2007/0093359 A1* | 4/2007 | Kobayashi et al. ....... 477/107 |

FOREIGN PATENT DOCUMENTS

| | | | |
|---|---|---|---|
| JP | 6 066901 | 3/1994 | |
| JP | 6-205588 | 7/1994 | |
| JP | 7-274580 | 10/1995 | |
| JP | 7 274580 | 10/1995 | |
| JP | 07274580 A | * | 10/1995 |
| JP | 07337099 A | * | 12/1995 |
| JP | 8-149868 | 6/1996 | |
| JP | 2001-112283 | 4/2001 | |
| JP | 2005 287233 | 10/2005 | |
| JP | 2006 20381 | 1/2006 | |
| JP | 2006 50803 | 2/2006 | |
| JP | 2006-158182 | 6/2006 | |
| JP | 2006 158182 | 6/2006 | |

* cited by examiner

FIG. 3

| SWITCHING ELEMENT | TEST PATTERN INTENDED FOR LOWER SWITCHING ELEMENT SHORT-CIRCUIT FAULT | | |
|---|---|---|---|
| | PATTERN UP (FIG. 5 — S21) | PATTERN VP (FIG. 5 — S26) | PATTERN WP (FIG. 5 — S31) |
| UP | ON | OFF | OFF |
| VP | OFF | ON | OFF |
| WP | OFF | OFF | ON |
| UN | OFF | OFF | OFF |
| VN | OFF | OFF | OFF |
| WN | OFF | OFF | OFF |

FIG. 4

| SWITCHING ELEMENT | TEST PATTERN INTENDED FOR UPPER SWITCHING ELEMENT SHORT-CIRCUIT FAULT | | |
|---|---|---|---|
| | PATTERN UN (FIG. 6 — S41) | PATTERN VN (FIG. 6 — S46) | PATTERN WN (FIG. 6 — S51) |
| UP | OFF | OFF | OFF |
| VP | OFF | OFF | OFF |
| WP | OFF | OFF | OFF |
| UN | ON | OFF | OFF |
| VN | OFF | ON | OFF |
| WN | OFF | OFF | ON |

FIG. 14

| | TEST PATTERN INTENDED FOR INTER-PHASE SHORT-CIRCUIT FAULT | | |
|---|---|---|---|
| SWITCHING ELEMENT | PATTERN UV (FIG. 13 – S91) | PATTERN VW (FIG. 13 – S96) | PATTERN WU (FIG. 13 – S101) |
| UP | ON | OFF | OFF |
| VP | OFF | ON | OFF |
| WP | OFF | OFF | ON |
| UN | OFF | OFF | ON |
| VN | ON | OFF | OFF |
| WN | OFF | ON | OFF |

ELECTRIC MOTOR CONTROL APPARATUS

TECHNICAL FIELD

The present invention relates to an electric motor control apparatus, and, for example, relates to an electric motor control apparatus for locating a short-circuit fault point in a system.

BACKGROUND ART

A conventional electric motor control apparatus is provided with a current detector at a DC section of an inverter to locate a short-circuit fault point based on a diagnosis pattern for turning on switching elements of the inverter and a current detection value at the DC section (refer to Patent Document 1, for example).

Moreover, another conventional electric motor control apparatus is provided with current detectors on wiring between a motor and an inverter to locate a switching element under a short-circuit fault based on "on" signals fed to switching elements, and detection values obtained by the current detectors (refer to Patent Document 2, for example).

Patent Document 1: JP 3108964 B
Patent Document 2: JP 06-22446 A

DISCLOSURE OF THE INVENTION

Problems to be Solved by the Invention

However, in the example as described in the above-mentioned Patent Document 1, the current is detected at the DC section, and hence currents in respective phases cannot be acquired, whereby details in current paths are not clarified, and accuracy for locating a fault point is low. For example, when a switching element is under a short-circuit fault, or when wiring between the motor and the inverter is short-circuited to power or ground, in a case where a certain external force or a continuing rotational inertial force of the motor itself generated before the fault rotates the motor, a counter-electromotive force generated by the rotation of the motor causes an unexpected current to flow via the short-circuit point, and this current possibly causes a false location.

In the example as in Patent Document 2, the currents are detected on the wiring between the motor and the inverter. Hence, for example, when locating a switching element under a short-circuit fault, only a current which has routed via windings of the motor is detected, whereby a long period is necessary for a current to respond due to influence of a winding inductance, resulting in a long period before a short-circuit point is located. Moreover, there poses a problem that this current generates an undesirable motor torque. Moreover, as in Patent Document 1, a case in which the motor generates a counter-electromotive force is not considered, and hence, when a switching element is under a short-circuit fault, or when wiring between the motor and the inverter is short-circuited to power or ground, a current generated by the counter-electromotive force of the motor may be determined by mistake as a short-circuit current.

The present invention has been made in view of the above-mentioned problems in the conventional examples, and it is therefore an object of the present invention to provide an electric motor control apparatus which can quickly and accurately locate a short-circuit fault point when a short-circuit fault occurs in a system.

Means for Solving the Problems

An electric motor control apparatus according to the present invention includes: current control means for determining respective phase voltage commands according to a torque current command corresponding to a target value of a torque generated by an electric motor, and currents flowing in respective phases of the electric motor; a switching element drive circuit for instructing, based on the respective phase voltage commands received from the current control means, an inverter to perform a switching operation; the inverter for receiving a switching operation signal from the switching element drive circuit, and applying, through switching elements provided in the respective phases, voltages to the respective phases of the electric motor to cause currents to flow in the respective phases of the electric motor, and drive the electric motor; current detectors disposed in series with the switching elements in the respective phases of the inverter; and short-circuit point locating means for storing a test pattern indicative of a predetermined combination for turning on the switching elements of the inverter, and for locating a short-circuit fault point based on the test pattern and current detection values in the respective phases detected by the current detectors in response to the test pattern.

Effects of the Invention

According to the present invention, the current detectors are disposed in series with the switching elements in the respective phases, and hence it is possible to grasp details of the current paths. Further, the determination can be made based on currents which are not routed via motor windings and thus respond quickly, and hence it is possible to locate the short-circuit fault point accurately and in a short period of time.

BRIEF DESCRIPTION OF THE DRAWINGS

FIG. 3 is a table illustrating test patterns according to first to third embodiments of the present invention.

FIG. 4 is a table illustrating test patterns according to the first to third embodiments of the present invention.

FIG. 14 is a table illustrating test patterns according to the third embodiment of the present invention.

BEST MODE FOR CARRYING OUT THE INVENTION

A description herein is given of an example of a three-phase brushless motor as an electric motor, but the present invention is not limited to this example, and can be used for electric motors driven for rotation by a multi-phase AC.

First Embodiment

Figure 1:
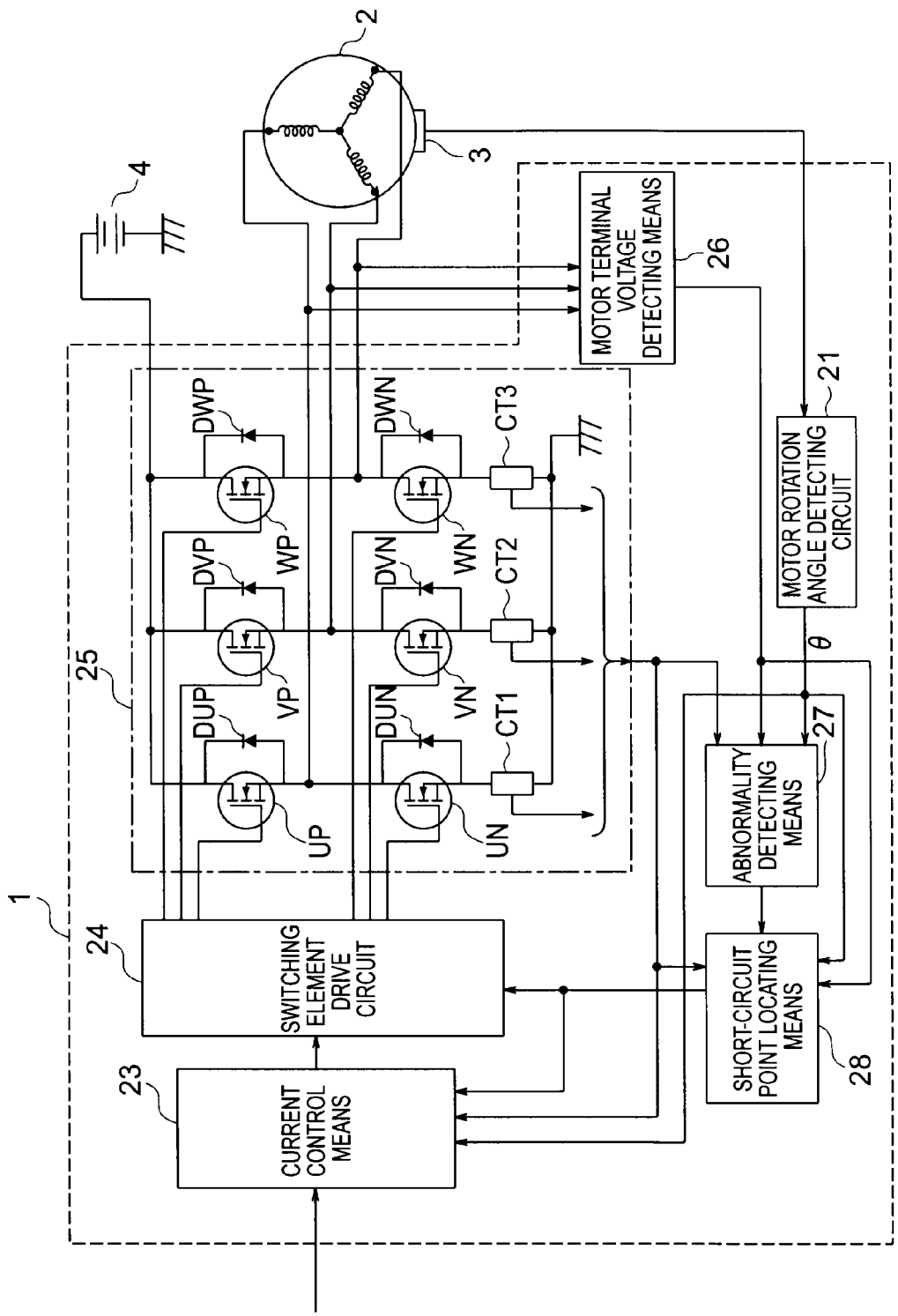
FIG. 1 is a block diagram illustrating an overall configuration of an electric motor control apparatus according to a first embodiment of the present invention.

FIG. 1 is a block diagram illustrating an overall configuration of an electric motor control apparatus according to a first embodiment of the present invention. An electric motor control apparatus 1 controls a brushless motor (referred to also as motor hereinafter) 2, which is an electric motor including windings in three phases which are U, V, and W phases. This electric motor control apparatus 1 receives a signal from a motor angle sensor 3 for detecting a rotation angle of the motor 2, and calculates a rotation angle of the motor 2 on a motor rotation angle detecting circuit 21. Moreover, this electric motor control apparatus 1 uses current detectors CT1, CT2, and CT3 to detect currents flowing through the respective phases of the motor 2.

The electric motor control apparatus 1 includes current control means 23 for determining a three-phase voltage command according to a torque current command (also referred to as q-axis current command hereinafter) corresponding to a target value of the motor torque, detected currents in the respective motor phases, and a motor rotation angle, a switching element drive circuit 24 for modulating the three-phase voltage command received from the current control means 23 by the PWM modulation, thereby instructing an inverter 25 to carry out a switching operation, and the inverter 25 for receiving switching operation signals from the switching element drive circuit 24, thereby providing chopper control of switching elements UP, UN, VP, VN, WP, and WN constituted by FETs, and causing currents to flow in the respective phases of the motor 2 from an electric power supplied by a battery 4. It should be noted that the current control means 23 can determine the three-phase voltage command according to the torque current command and the detected currents in the respective motor phases, and the motor rotation angle is not necessarily required.

From the currents flowing from the inverter 25 to the respective phases of the motor 2, the motor 2 generates the motor torque. It should be noted that the current detectors CT1, CT2, and CT3 are respectively disposed in series with the switching elements for the respective phases. According to this first embodiment, the current detectors CT1, CT2, and CT3 are respectively disposed serially on the ground side of the lower switching elements UN, VN, and WN. Moreover, for the respective switching elements UP, UN, VP, VN, WP, and WN, diodes DUP, DUN, DVP, DVN, DWP, and DWN are respectively disposed in parallel. Those diodes are generally disposed in order to protect the switching elements.

Moreover, the electric motor control apparatus 1 includes motor terminal voltage detecting means 26 for detecting a motor average voltage of an average of the three phases, and abnormality detecting means 27 for, based on the detected currents for the respective phases, the motor rotation angle, and a motor average voltage VM of an average of the three phases detected by the motor terminal voltage detecting means 26, determining whether the inverter 25 or the motor 2 is normal or not. This abnormality detection configuration may employ a method such as that disclosed in Japanese Patent Application Laid-open No. 2003-348900 or Japanese Patent No. 3556678.

Further, the electric motor control apparatus 1 includes short-circuit point locating means 28 which stores test patterns indicating a predetermined combination to turn on the switching element of the inverter 25, is activated when the abnormality detecting means 27 determines presence of an abnormality, and, as described later, based on the motor average voltage, the test patterns, and detected currents in the respective phases flowing in response to the test patterns, locates a switching element under a short-circuit fault. When the short-circuit point locating means 28 locates a short-circuit fault point, the short-circuit point locating means 28 takes an action such as stopping drive for only a phase experiencing the fault, thereby preventing a switching element from being burnt and lost, and continues an operation using normal phases as an emergency operation.

Figure 2:
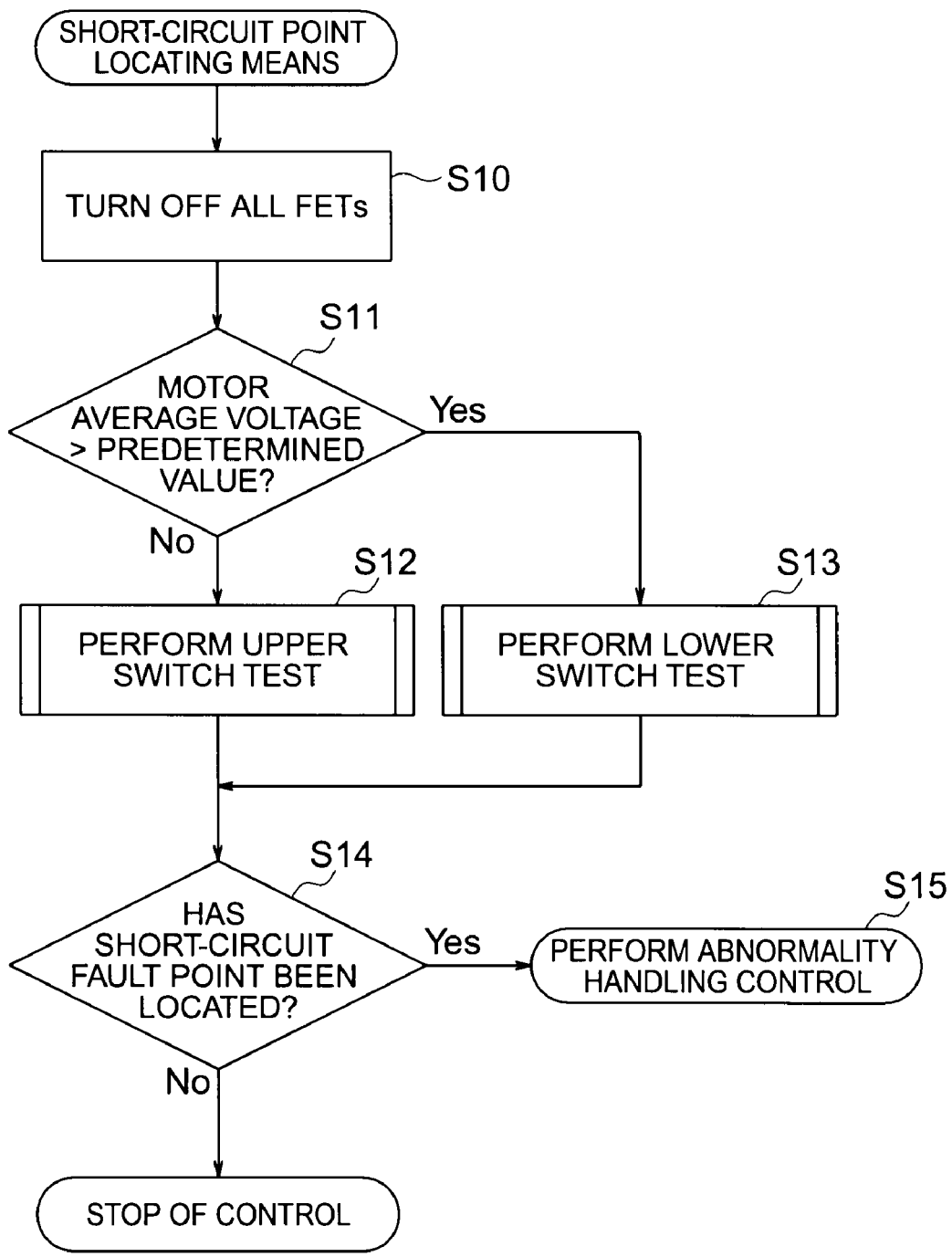
FIG. 2 is a flowchart illustrating operation contents of short-circuit point locating means 28 of FIG. 1.

A description is now given of the short-circuit point locating means 28. When the abnormality detecting means 27 determines that a certain abnormality has occurred in the inverter 25 or the motor 2, the short-circuit point locating means 28 starts an operation as illustrated in FIG. 2. First, the short-circuit point locating means 28 turns off all FETs which are the switching elements (Step S10).

Then, in Step S11, the short-circuit point locating means 28 compares the motor average voltage VM detected by the motor terminal voltage detecting means 26 to a predetermined threshold. As a result, when a period during which the motor average voltage VM is smaller than the predetermined threshold continues for more than a predetermined period, it is suspected that any one of the lower switching elements (UN, VN, and WN) of the inverter 25 is under a short-circuit fault, and thus the short-circuit point locating means 28 carries out an upper switch test illustrated in FIG. 3 (Step S12).

In Step S11, when the period during which the motor average voltage VM is larger than the predetermined threshold continues for more than a predetermined period, it is suspected that any one of the upper switching elements (UP, VP, and WP) of the inverter 25 is under a short-circuit fault, and thus the short-circuit point locating means 28 carries out a lower switch test illustrated in FIG. 4 (Step S13).

As a result of those switch tests, when a short-circuit fault point is located, the short-circuit point locating means 28 carries out an abnormality handling control (Steps S14 and S15). On this occasion, the abnormality handling control takes an action such as stopping drive for only a phase experiencing the fault, thereby preventing a switching element from being burnt and lost, and continues an operation using normal phases as an emergency operation. When a short-circuit fault point has not been located, the short-circuit point locating means 28 stops control.

On this occasion, the short-circuit point locating means 28 stores, as the test patterns for the switch tests indicating the predetermined combination to turn on the switching element of the inverter 25, test patterns for locating a short-circuit fault by turning on any one of the upper or lower switching elements in the respective phases of the inverter 25, and by turning off the other switching elements.

FIG. 3 illustrates the test patterns intended for a short-circuit fault of the lower switching elements. The pattern UP turns on only the switching element UP, and turns off the other switching elements thereby locating a short-circuit fault. Similarly, the pattern VP turns on only the switching element VP, and turns off the other switching elements thereby locating a short-circuit fault, and the pattern WP turns on only the switching element WP, and turns off the other switching elements thereby locating a short-circuit fault.

FIG. 4 illustrates the test patterns intended for a short-circuit fault of the upper switching elements. The pattern UN turns on only the switching element UN, and turns off the other switching elements thereby locating a short-circuit fault. Similarly, the pattern VN turns on only the switching element VN, and turns off the other switching elements thereby locating a short-circuit fault, and the pattern WN turns on only the switching element WN, and turns off the other switching elements thereby locating a short-circuit fault.

A description is now given of the upper switch test in Step S12 described above referring to FIG. 5. In the following description, the sign of the currents in the respective phases is positive when the currents flow upward through the respective current detectors in FIG. 1. First, the short-circuit point locating means 28 once turns on the switching element UP (Step S21), causes the current detector CT1 to detect the U-phase current (Step S22), and immediately turns off the switching element UP (Step S23). This U-phase current detection value is stored as IU. It should be noted that this test may be repeated multiple times, and the average value or the maximum value of the current detection values may be set as IU.

In Step S24, the short-circuit point locating means 28 determines whether the sign of IU is negative, and whether the magnitude thereof is larger than a predetermined value indicating an excessive current. When those conditions are met, the short-circuit point locating means 28 determines that the U-phase lower switching element UN is under a short-circuit fault (Step S25). It should be noted that, in Step S22, the short-circuit point locating means 28 may detect, in addition to the U-phase current, the V-phase and W-phase currents, and store the detected currents respectively as IV and IW. Further, the determination conditions in Step S24 may be that the sign of the IU is negative, the magnitude thereof is larger than the predetermined value representing an excessive current, and both the magnitudes of IV and IW are smaller than a predetermined value representing a normal value.

The same processing is carried out for the V phase and the W phase. The processing for the V phase is illustrated in Step S26 to Step S30. The short-circuit point locating means 28 once turns on the switching element VP, causes the current detector CT2 to detect the V-phase current, and immediately turns off the switching element VP, thereby setting and storing this V-phase current detection value as IV. It should be noted that this test may be repeated multiple times, and the average value or the maximum value of the current detection values may be set as IV.

In Step S29, the short-circuit point locating means 28 determines whether the sign of IV is negative, and whether the magnitude thereof is larger than a predetermined value indicating an excessive current. When those conditions are met, the short-circuit point locating means 28 determines that the switching element VN is under a short-circuit fault (Step S30). It should be noted that, in Step S27, the short-circuit point locating means 28 may detect, in addition to the V-phase current, the U-phase and W-phase currents, and store the detected currents respectively as IU and IW. Further, the determination conditions in Step S29 may be that the sign of the IV is negative, the magnitude thereof is larger than the predetermined value representing an excessive current, and both the magnitudes of IU and IW are smaller than a predetermined value representing a normal value.

The processing for the W phase is illustrated in Step S31 to Step S35. The short-circuit point locating means 28 once turns on the switching element WP, causes the current detector CT3 to detect the W-phase current, and immediately turns off the switching element WP, thereby setting and storing this W-phase current detection value as IW. It should be noted that this test may be repeated multiple times, and the average value or the maximum value of the current detection values may be set as IW.

In Step S34, the short-circuit point locating means 28 determines whether the sign of IW is negative, and whether the magnitude thereof is larger than a predetermined value indicating an excessive current. When those conditions are met, the short-circuit point locating means 28 determines that the switching element WN is under a short-circuit fault (Step S35). It should be noted that, in Step S32, the short-circuit point locating means 28 may detect, in addition to the W-phase current, the U-phase and V-phase currents, and store the detected currents respectively as IU and IV. Further, the determination conditions in Step S34 may be that the sign of the IW is negative, the magnitude thereof is larger than the predetermined value representing an excessive current, and both the magnitudes of IU and IV are smaller than a predetermined value representing a normal value.

A description is now given of the upper switch test in Step S13 described above referring to FIG. 4. First, the short-circuit point locating means 28 once turns on the switching element UN (Step S41), causes the current detector CT1 to detect the U-phase current (Step S42), and immediately turns off the switching element UN (Step S43). This U-phase current detection value is stored as IU. It should be noted that this test may be repeated multiple times, and the average value or the maximum value of the current detection values may be set as IU.

In Step S44, the short-circuit point locating means 28 determines whether the sign of IU is negative, and whether the magnitude thereof is larger than a predetermined value indicating an excessive current. When those conditions are met, the short-circuit point locating means 28 determines that the U-phase upper switching element UP is under a short-circuit fault (Step S45). It should be noted that, in Step S42, the short-circuit point locating means 28 may detect, in addition to the U-phase current, the V-phase and W-phase currents, and store the detected currents respectively as IV and IW. Further, the determination conditions in Step S44 may be that the sign of the IU is negative, the magnitude thereof is larger than the predetermined value representing an excessive current, and both the magnitudes of IV and IW are smaller than a predetermined value representing a normal value.

The same processing is carried out for the V phase and the W phase. The processing for the V phase is illustrated in Step S46 to Step S50. The short-circuit point locating means 28 once turns on the switching element VN, causes the current detector CT2 to detect the V-phase current, and immediately turns off the switching element VN, thereby setting and storing this V-phase current detection value as IV. It should be noted that this test may be repeated multiple times, and the average value or the maximum value of the current detection values may be set as IV.

In Step S49, the short-circuit point locating means 28 determines whether the sign of IV is negative, and whether the magnitude thereof is larger than a predetermined value indicating an excessive current. When those conditions are met, the short-circuit point locating means 28 determines that the switching element VP is under a short-circuit fault (Step S50). It should be noted that, in Step S47, the short-circuit point locating means 28 may detect, in addition to the V-phase current, the U-phase and W-phase currents, and store the detected currents respectively as IU and IW. Further, the determination conditions in Step S49 may be that the sign of the IV is negative, the magnitude thereof is larger than the predetermined value representing an excessive current, and both the magnitudes of IU and IW are smaller than a predetermined value representing a normal value.

The processing for the W phase is illustrated in Step S51 to Step S55. The short-circuit point locating means 28 once turns on the switching element WN, causes the current detector CT3 to detect the W-phase current, and immediately turns off the switching element WN, thereby setting and storing this W-phase current detection value as IW. It should be noted that this test may be repeated multiple times, and the average value or the maximum value of the current detection values may be set as IW.

In Step S54, the short-circuit point locating means 28 determines whether the sign of IW is negative, and whether the magnitude thereof is larger than a predetermined value indicating an excessive current. When those conditions are met, the short-circuit point locating means 28 determines that the switching element WP is under a short-circuit fault (Step S55). It should be noted that, in Step S52, the short-circuit point locating means 28 may detect, in addition to the W-phase current, the U-phase and V-phase currents, and store the detected currents respectively as IU and IV. Further, the determination conditions in Step S54 may be that the sign of the IW is negative, the magnitude thereof is larger than the predetermined value representing an excessive current, and both the magnitudes of IU and IV are smaller than a predetermined value representing a normal value.

In the above-mentioned switch tests, it is necessary to determine a period from the turning on to the turning off of the respective switching elements by considering a response time of the current. For example, it is assumed that the V-phase lower switching element VN is under a short-circuit fault. On this occasion, when the switching element VP is turned on, a closed circuit routing from a positive electrode of the power supply 4, via the switching elements VP and VN, and the current detector CT2, back to a power-supply negative electrode is formed. The impedance of this closed circuit is formed only of an on-resistance of the switching elements, and minute impedances of the current detector and wiring, and the current flowing through the closed circuit is thus very large, and a response delay is very small. This current value is detected by the current detector CT2 of the V phase in which the switching element is turned on.

On the other hand, also in the case where the V-phase lower switching element VN is under a short-circuit fault, even when the U-phase upper switching element UP is turned on, a current does not flow through the U-phase current detector CT1. This is because no closed circuit including the current detector CT1 exists. Moreover, when the V-phase upper switching element VP is under a short-circuit fault, and the U-phase lower switching element UN is turned on, a closed circuit routing from the positive electrode of the power supply 4, via the switching element VP, the windings of the motor 2, the switching element UN, and the current detector CT1, back to the power-supply negative electrode is formed. However, a long response time is necessary for the current routing via the windings of the motor 2 due to a winding inductance. This is because, generally, a motor winding, compared with the impedance in the inverter circuit, has a significantly large inductance component, and, for a response of the current, compared with a closed circuit without motor windings in the inverter, a very long period is necessary. In the switch test, when the period of being turned on is set to sufficiently short, this current does not respond.

Thus, the period during which a switching element is turned on in the switching test may be set to a very short period sufficient for a response via the short-circuit path with the very small impedance in the inverter circuit. Moreover, this setting can prevent an unnecessary current from flowing through the motor windings.

Figure 6:
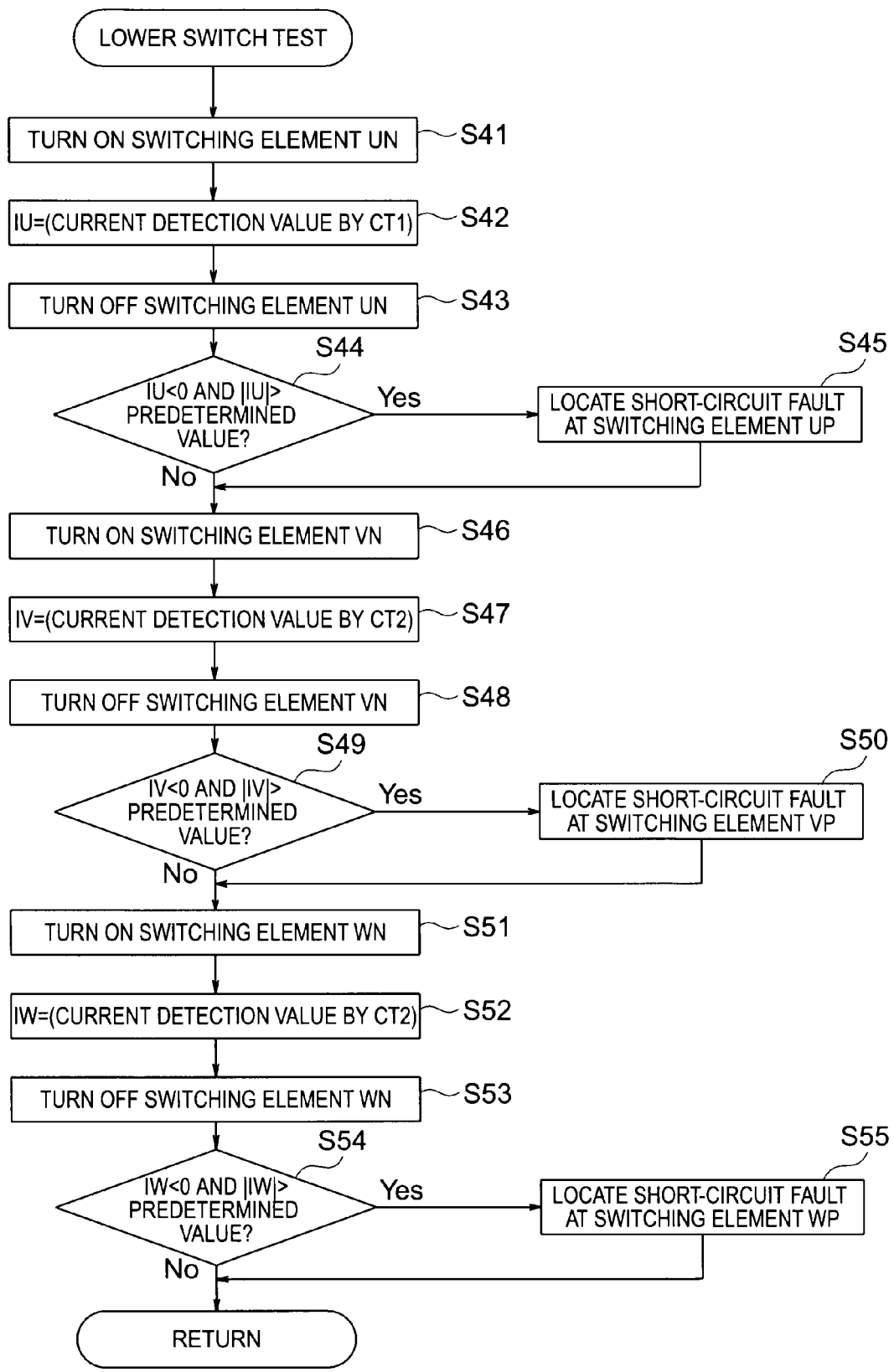
FIG. 6 is a flowchart illustrating contents of a lower switch test of FIG. 2.
Figure 7:
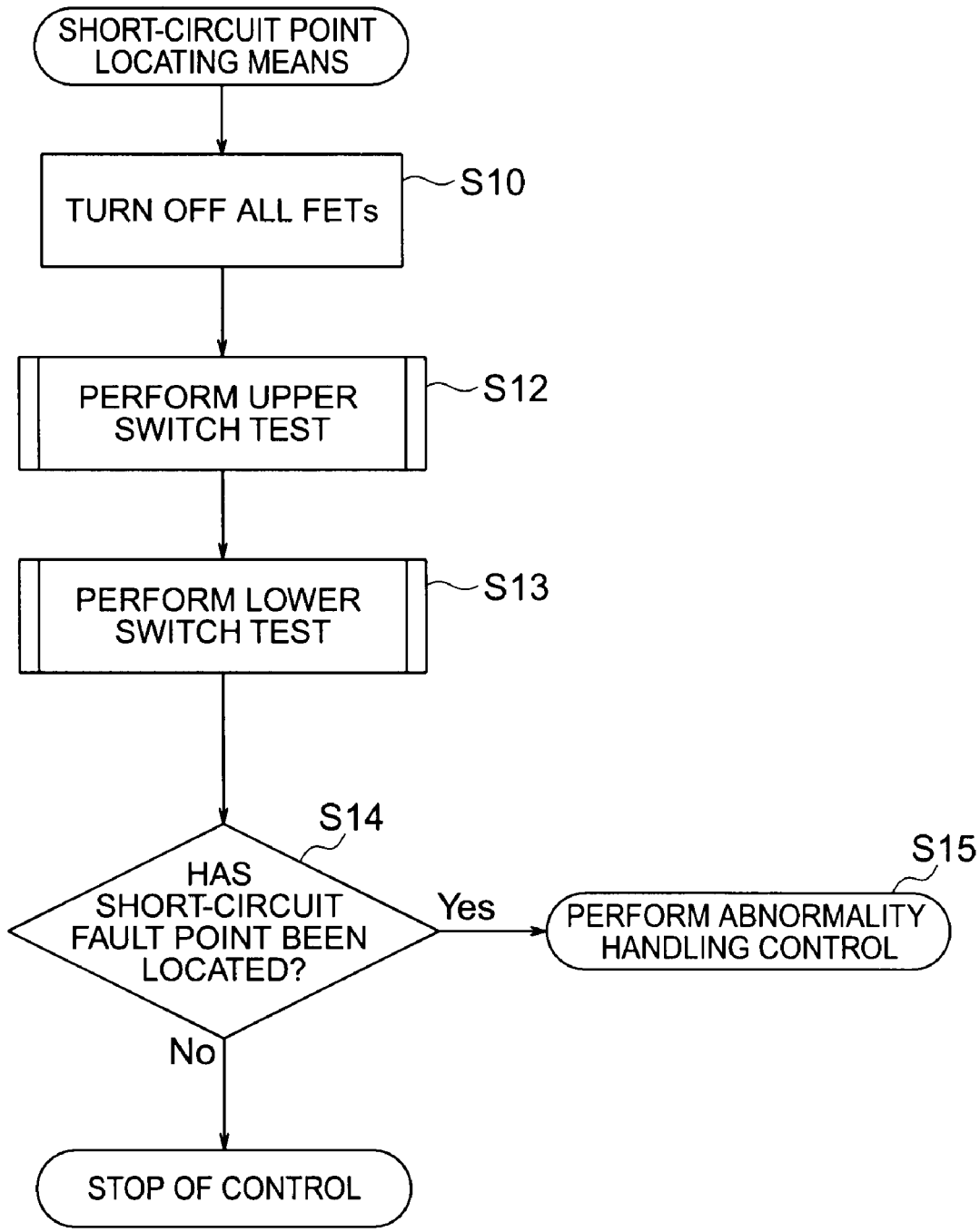
FIG. 7 is a flowchart illustrating operation contents of the short-circuit point locating means 28 of FIG. 1, which is an alternative of FIG. 2.

Moreover, the short-circuit point locating means 28 may follow a flowchart illustrated in FIG. 7, in place of that illustrated in FIG. 2. First, the short-circuit point locating means 28 turns off all the switching elements (Step S10). Then, the short-circuit point locating means 28 carries out the upper switch test illustrated in FIG. 5 (Step S12), and, then, carries out the lower switch test illustrated in FIG. 6 (Step S13). The sequence of Step S12 and Step S13 may be reversed. Compared with FIG. 7, the method illustrated in FIG. 2 can limit the patterns to be carried out, and, thus, can reduce the period required for locating a short-circuit point.

As described above, according to this first embodiment, the short-circuit fault locating means 28 stores the test patterns indicating the combination to turn on the switching element of the inverter 25, and locates a short-circuit fault point based on the test patterns, and, as responses thereto, the current detection values in the respective phases flowing through the current detectors CT1 to CT3. Hence, it is possible, without hardly causing a current to flow in the windings of the motor 2, to locate a short-circuit fault point, and to avoid an output of an undesirable motor torque. Moreover, it is possible to reduce a period required for locating a short-circuit point. Further, a current is not detected at a DC section connected to the power supply 4, but is detected for the respective phases, and the current paths are recognized in detail, thereby locating a short-circuit fault point. As a result, the locating can be performed accurately.

Moreover, the current detectors CT1 to CT3 are disposed in series with the switching elements for the respective phases, and hence it is possible to recognize details in the current paths, and the determination can be made based on the currents which do not route via the motor windings and thus respond quickly. Accordingly, it is possible to locate a short-circuit fault point accurately and quickly.

Further, the short-circuit fault locating means 28 selects test patterns to be carried out based on the voltage detection values of the motor terminals by the motor terminal voltage detecting means 26, and limits the number of the test patterns to be carried out, and hence it is possible to reduce the period required for the locating operation.

On the other hand, in a case such as Patent Document 1, only one current detector is disposed in a DC section connected to a power supply, and details in current paths cannot be recognized. Therefore, for example, as described later (refer to FIG. 6), a counter-electromotive force caused by the motor rotation may generate a current, and, based on this current, a false determination may be made. For example, the U-phase lower switching element UN is under a short-circuit fault, which is different from FIG. 6. On this occasion, when the V-phase upper switching element VP is turned on, a closed circuit routing from the power supply 4, via the switching element VP, the windings of the motor 2, the switching element UN, and the current detector CT1, back to the power supply 4 is formed, and a large current flows due to influence of the counter-electromotive force caused by the motor rotation. In this case, according to the present invention, a current is detected only by the U-phase current detector CT1 which is different in phase from the switching element VN being turned on, and a current is not detected by the V-phase current detector CT2 used for the determination, and therefore there is no fear that the determination fails. The method according to Patent Document 1 cannot make this discrimination, and determines by mistake that the switching element VP is under a short-circuit fault.

Moreover, in an example such as Patent Document 2, currents are detected on wiring between a motor and an inverter, and hence, when a switching element under a short-circuit fault is to be located, only currents which route via motor windings can be detected, and, thus, winding inductances causes a long period before a current responses. As a result, in the example such as Patent Document 2, it is impossible to avoid the problem that the period required for locating a short-circuit fault point is long, and those currents generate an undesirable motor torque.

Second Embodiment

Before a description of a second embodiment of the present invention, a description is given of a problem caused by a rotation of a motor. When a short-circuit fault point is to be located, the rotation of the motor is not necessarily stopped, and the motor may be rotating thereby generating a counter-electromotive force. For example, there are a case in which a rotation immediately before the start of the locating operation for a short-circuit fault point continues due to an inertial force, and a case in which a motor is rotated by an external force from the outside. In this state, a counter-electromotive force is generated by the motor rotation on the motor windings, and generates a current in a closed circuit formed routing via a short-circuit fault point. Based on this current, a short-circuit fault point may be located by mistake.

Figure 8:
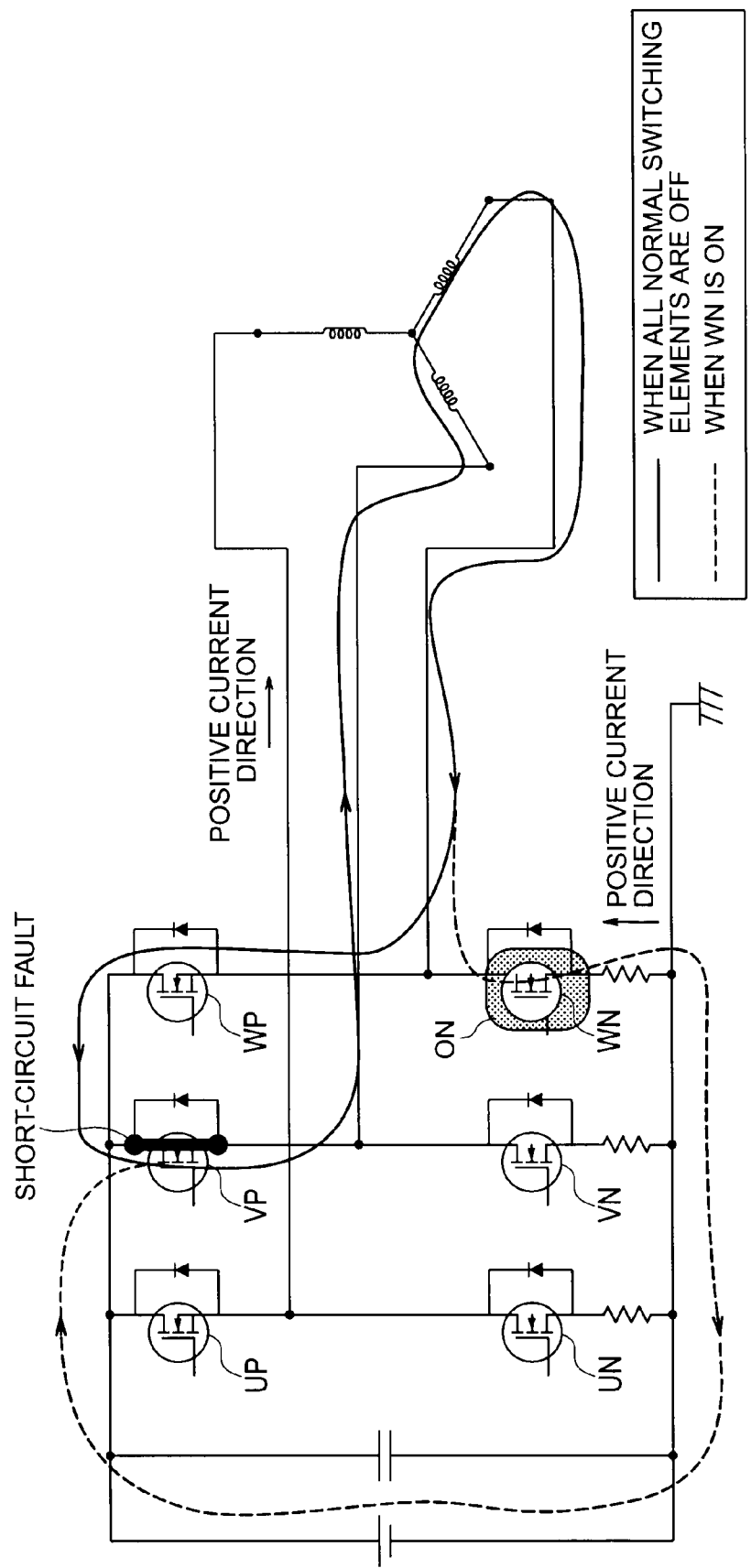
FIG. 8 is a circuit diagram describing a problem upon generation of a counter-electromotive force according to the second embodiment of the present invention.

For example, referring to FIG. 8, a specific description is given, and FIG. 8 illustrates a case in which the V-phase upper switching element VP is under a short-circuit fault. When the other switching elements are all turned off, routing via the short-circuit fault point (switching element VP), the windings of the motor 2, and the W-phase upper diode DWP, a closed circuit represented by a solid line in FIG. 8 is formed. Thus, when the motor 2 is rotating, a counter-electromotive force generates a current in this closed circuit.

In this state, when the lower switch test as illustrated in FIG. 6 is carried out, and the switching element WN is turned on, a closed circuit in a path represented by a dotted line in FIG. 8 is formed, and the current which has been flowing in the path represented by the solid line until immediately before will now flow in the path represented by the dotted line. On this occasion, the W-phase current detector CT3 is present on this path, and hence, in Step S52 of FIG. 6, the current generated by this counter-electromotive force is stored as IW, and a false determination may be made in Step S54.

Figure 9A:
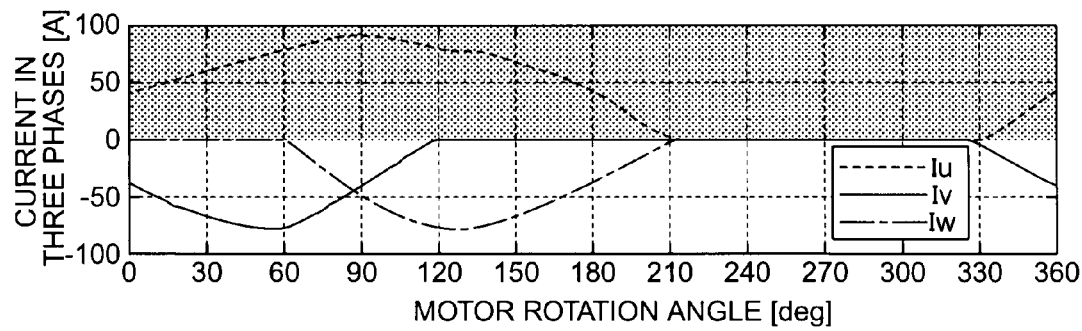
FIG. 9 are charts describing current waveforms upon generation of a counter-electromotive force during a rotation in a positive direction according to the second embodiment of the present invention, in which (a) is an explanatory chart when a U-phase upper switching element is under a short-circuit fault, (b) is an explanatory chart when a V-phase upper switching element is under a short-circuit fault, and (c) is an explanatory chart when a W-phase upper switching element is under a short-circuit fault.
Figure 9B:
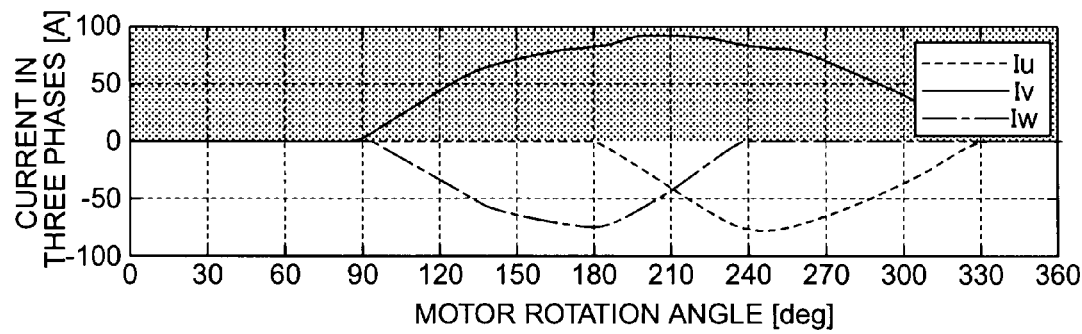
Figure 9C:
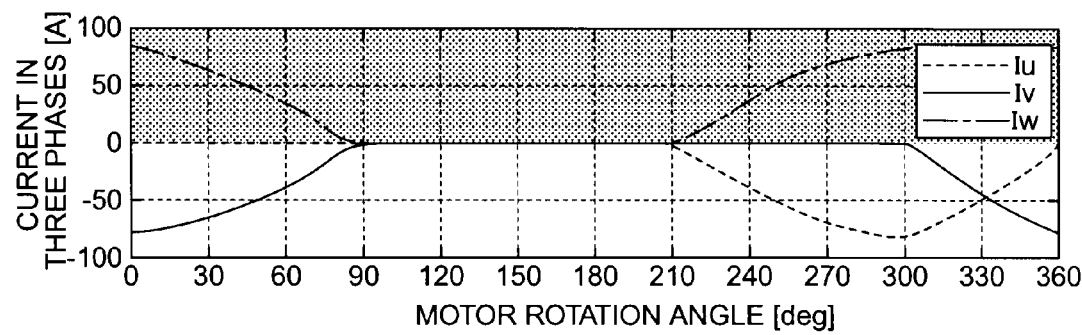
Figure 10A:
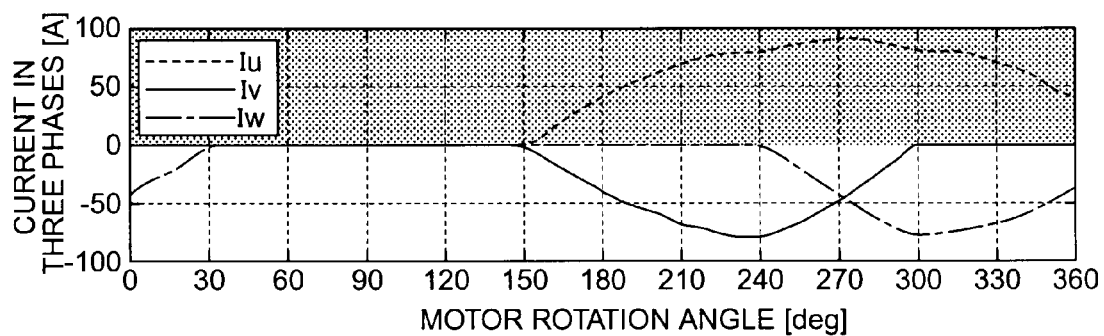
FIG. 10 are charts describing current waveforms upon generation of a counter-electromotive force during a rotation in a negative direction according to the second embodiment of the present invention, in which (a) is an explanatory chart when the U-phase upper switching element is under a short-circuit fault, (b) is an explanatory chart when the V-phase upper switching element is under a short-circuit fault, and (c) is an explanatory chart when the W-phase upper switching element is under a short-circuit fault.
Figure 10B:
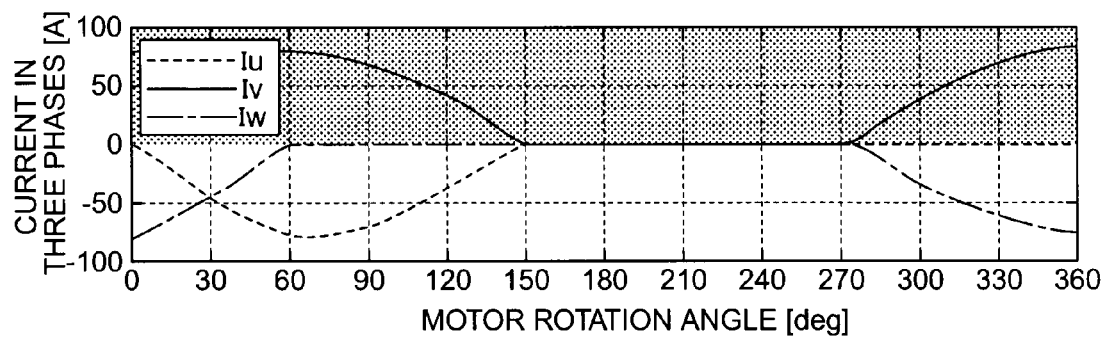
Figure 10C:
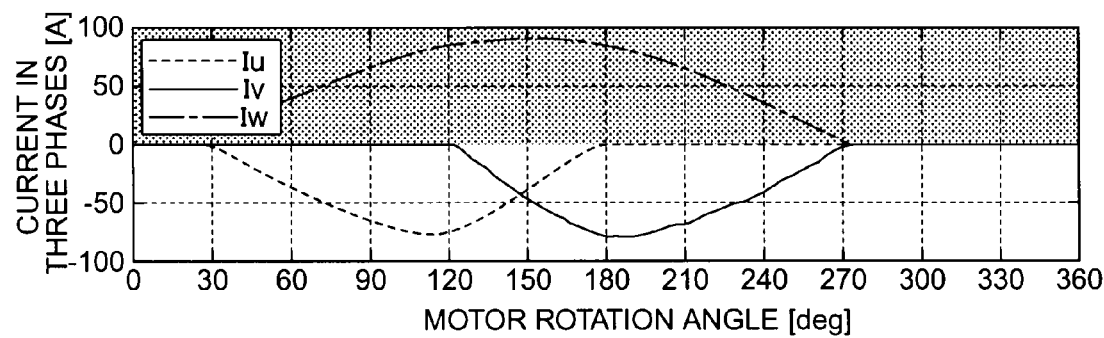

Moreover, in FIG. 8, only the current flowing through the W phase is illustrated, but a similar current may also be generated in the U phase. FIG. 9B illustrates waveforms generated by the counter-electromotive force on the motor windings when the V-phase upper switching element VP is under a short-circuit fault, and drawn with respect to the motor rotation angle. A current indicated as negative values is a current returning from the motor to the inverter, and this current passes through the current detector as illustrated by the path in the dotted line of FIG. 8, and thus causes the false determination. FIG. 9 illustrate waveforms generated by a counter-electromotive force respectively when the U-phase and W-phase upper switching elements are under a short-circuit fault. While FIG. 9 illustrate the waveforms when the motor is rotated in the positive direction by the counter-electromotive force, cases in which the motor is rotated in the negative direction are illustrated in FIG. 10 in a corresponding manner thereto.

Even when the lower switching element is under a short-circuit fault, a current is generated by a counter-electromotive force. However, in the configuration illustrated in FIG. 1, the current flows only in the positive direction in the current detector in a phase in the normal state (namely, flows through the current detector in the upward direction), and, with the configuration according to the first embodiment, there is no fear of false determination. Thus, a description is now given of a method according to this second embodiment for avoiding a false determination when the upper switching element is under a short-circuit fault.

Figure 11:
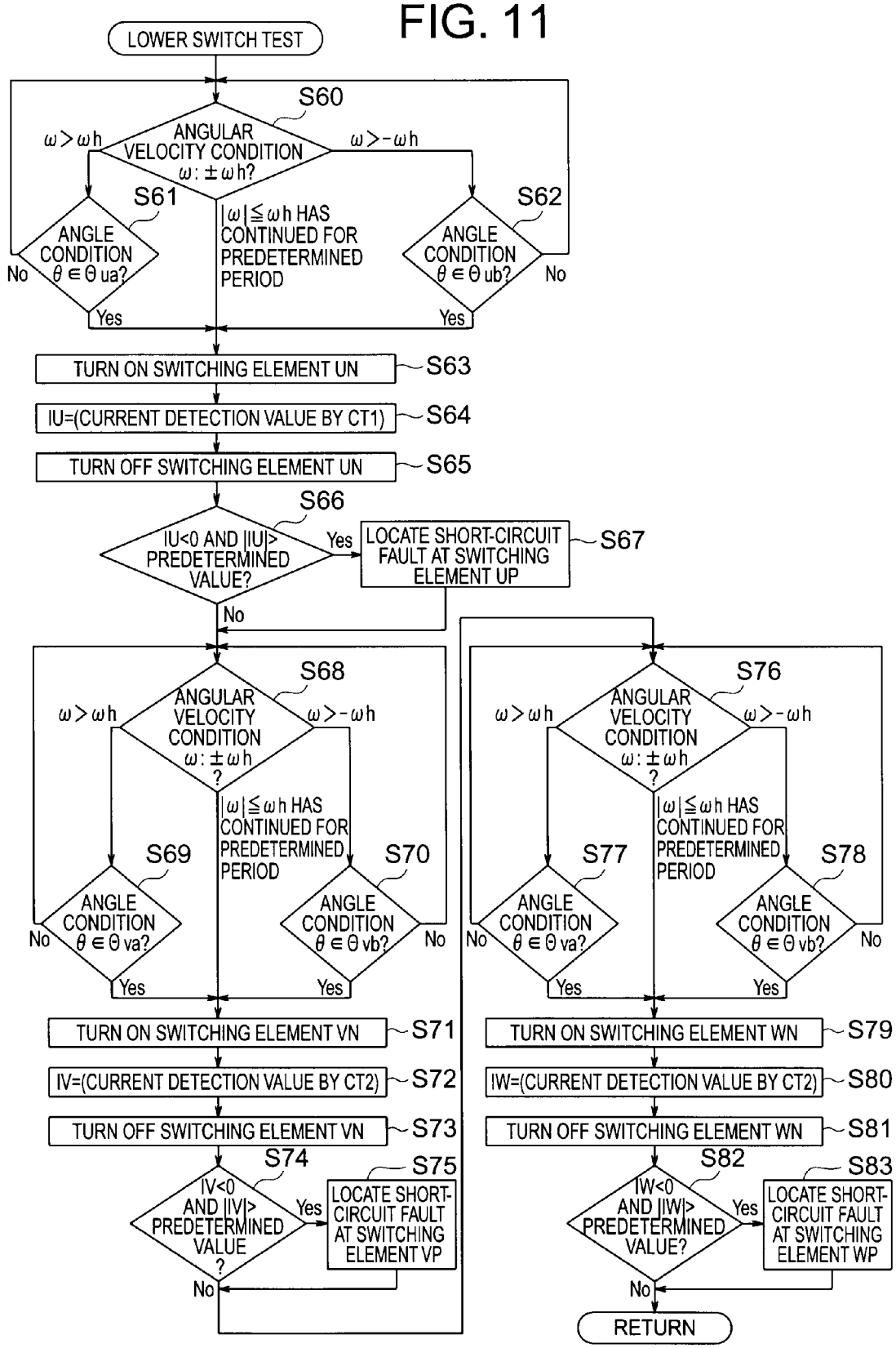
FIG. 11 is a flowchart illustrating contents of a lower switch test according to the second embodiment of the present invention.

According to this second embodiment, the lower switch test carried out by the short-circuit point locating means 28 illustrated in FIG. 6 according to the first embodiment is replaced by a lower switch test with angle condition illustrated in FIG. 11, and a motor rotational angular velocity calculated by differentiating the motor rotation angle is added to the determination conditions.

A description is now given of the lower switch test with angle condition illustrated in FIG. 11. First, in Step S60, the short-circuit point locating means 28 makes a determination using a motor rotational angular velocity ω from the motor rotation angle detecting means 21. When a period during which the magnitude of the motor rotational angular velocity is smaller than a predetermined threshold ωh has continued for more than a predetermine period, the short-circuit point locating means 28 immediately transitions to the switching test (to Step S63). When the sign of the motor rotational angular velocity is positive, and the magnitude is larger than the predetermined value, the short-circuit point locating means 28 transitions to angle condition determination illustrated in Step S61. When the sign of the motor rotational angular velocity is negative, and the magnitude is larger than the predetermined value, the short-circuit point locating means 28 transitions to angle condition determination illustrated in Step S62.

In Step S61, the short-circuit point locating means 28 determines whether or not a motor rotation angle θ is within a predetermined angle range Θua, and the short-circuit point locating means 28, when the motor rotation angle θ is within the predetermined angle range Θua, transitions to the switching test (to Step S63), and, otherwise, returns to Step S60. The predetermined angle range Θua in Step S61 is an angle range in which there is no fear that a current in the negative direction flows through the U-phase current detector CT1, and, it is appreciated from FIG. 9 that Θua=0 to 180 degrees.

In Step S62, similar processing as in Step S61 is carried out. However, an angle range Θub is different, and based on the same idea as for the positive rotation, it is appreciated from FIG. 10 that Θub=180 to 360 degrees.

Then, Steps S63 to S67 are carried out, and are the same processing as Steps S41 to S45 illustrated in FIG. 6 according to the first embodiment.

Figure 12:
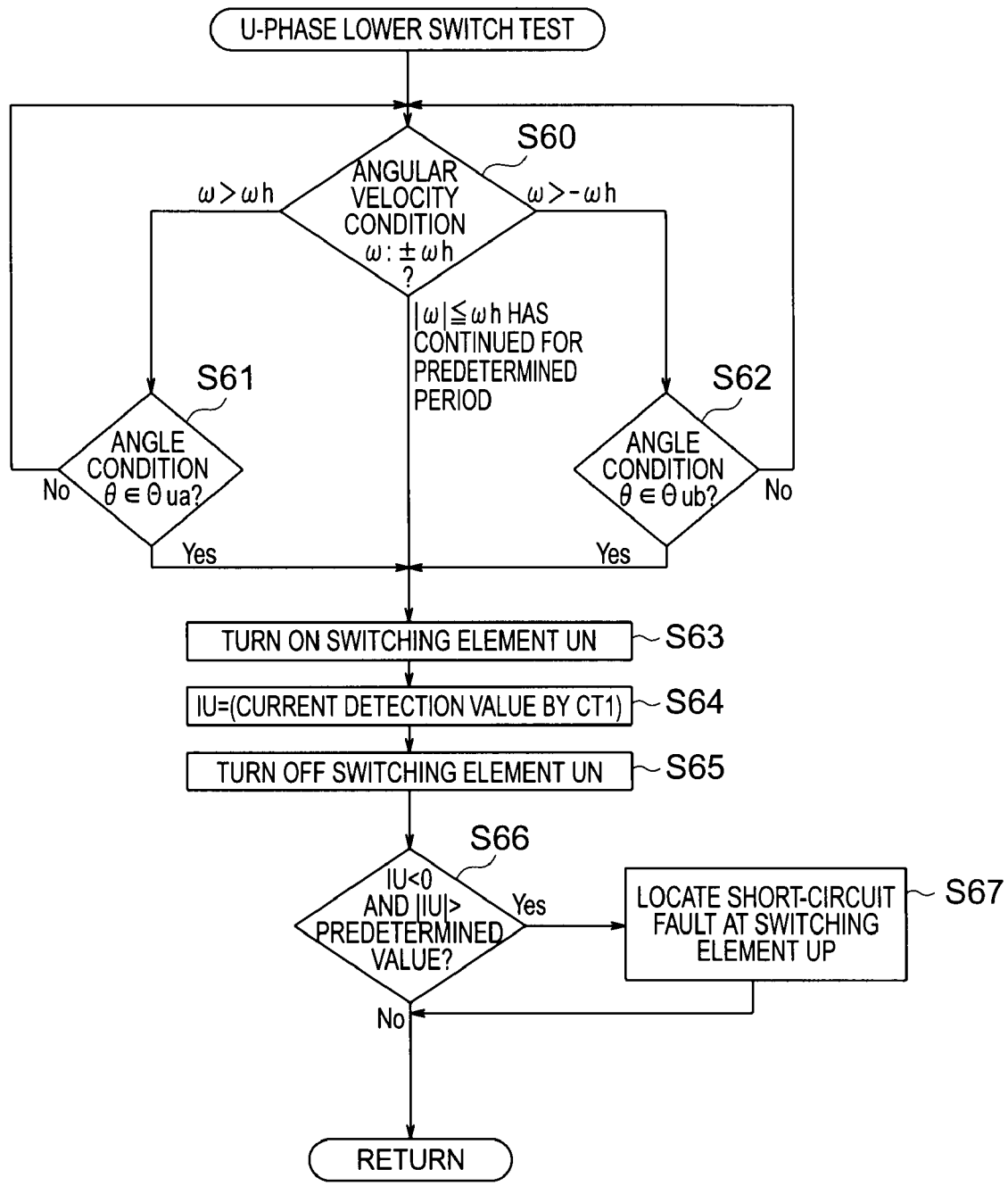
FIG. 12 is a flowchart illustrating contents of a U-phase lower switch test according to the second embodiment of the present invention.

Steps S60 to S67 described above are a section relating to the U phase, and FIG. 12 is a flowchart extracting and illustrating only this section. Steps S68 to S75 represent a section relating to the V phase, Steps S76 to S83 represent a section relating to the W phase, which may be described similarly to Steps S60 to S65 relating to the U phase, and a detailed description thereof, therefore, is omitted. It should be noted that angle ranges in the angle condition steps S69, S70, S77, and S78 are different. In Step S69, $\Theta va=120$ to 300 degrees, in Step S70, $\Theta vb=0$ to 120 and 300 to 360 degrees, in Step S77, $\Theta wa=0$ to 60 and 240 to 360 degrees, and in Step S78, $\Theta wb=60$ to 240 degrees.

According to this second embodiment, before locating a short-circuit fault point based on the test patterns and the current detection values, the conditions based on the motor rotation angle and the motor rotational angular velocity are added, and hence, even when the motor is rotating, there is no fear that a false determination is made due to influence of a current generated by a counter-electromotive force, and the short-circuit fault point can be accurately located. Moreover, it is not necessary to wait until the motor rotation becomes slow, and hence the period required for the locating operation can be reduced.

Moreover, in the above-mentioned description, the motor rotation angle and the motor rotational angular velocity are employed as the determination conditions. However, only with the condition according to the motor rotational angular velocity, when the determination is made after the rotation comes to a low velocity, it is possible to avoid the false determination due to the influence of the counter-electromotive force, resulting in an accurate locating operation. Moreover, only with the motor rotation angle, an accurate locating operating can also be carried out. This is because, since the angle range in which currents generated by a counter-electromotive force illustrated in FIGS. 9 and 10 do not flow is independent of the motor rotational angular velocity, only with the condition according to the motor rotation angle, it is possible to avoid a false determination caused by the influence of the counter-electromotive force.

Moreover, the above-mentioned description is given of the locating operation for the short-circuit fault of a switching element, but the short-circuit to power or ground of motor wiring are approximately the same phenomena, and therefore those faults can also be located by the same embodiment.

Moreover, the conditional determination can be made according to the motor rotation angle and the motor rotational angular velocity, and hence it is possible to eliminate fear of a false determination based on a current generated by the counter-electromotive power of the motor, with the result that it is possible to increase the accuracy of the locating operation for a fault point. As a result, not only when the motor is stationary, but also when the motor is rotating, a fault point can be located accurately and quickly.

Third Embodiment

According to the above-mentioned embodiments, the means for locating a short-circuit point of a short-circuit fault of a switching element or a short circuit to power or ground of motor wiring is described. According to this third embodiment, a description is given of a short-circuit fault between two phases among the U, V, and W phases.

Figure 13:
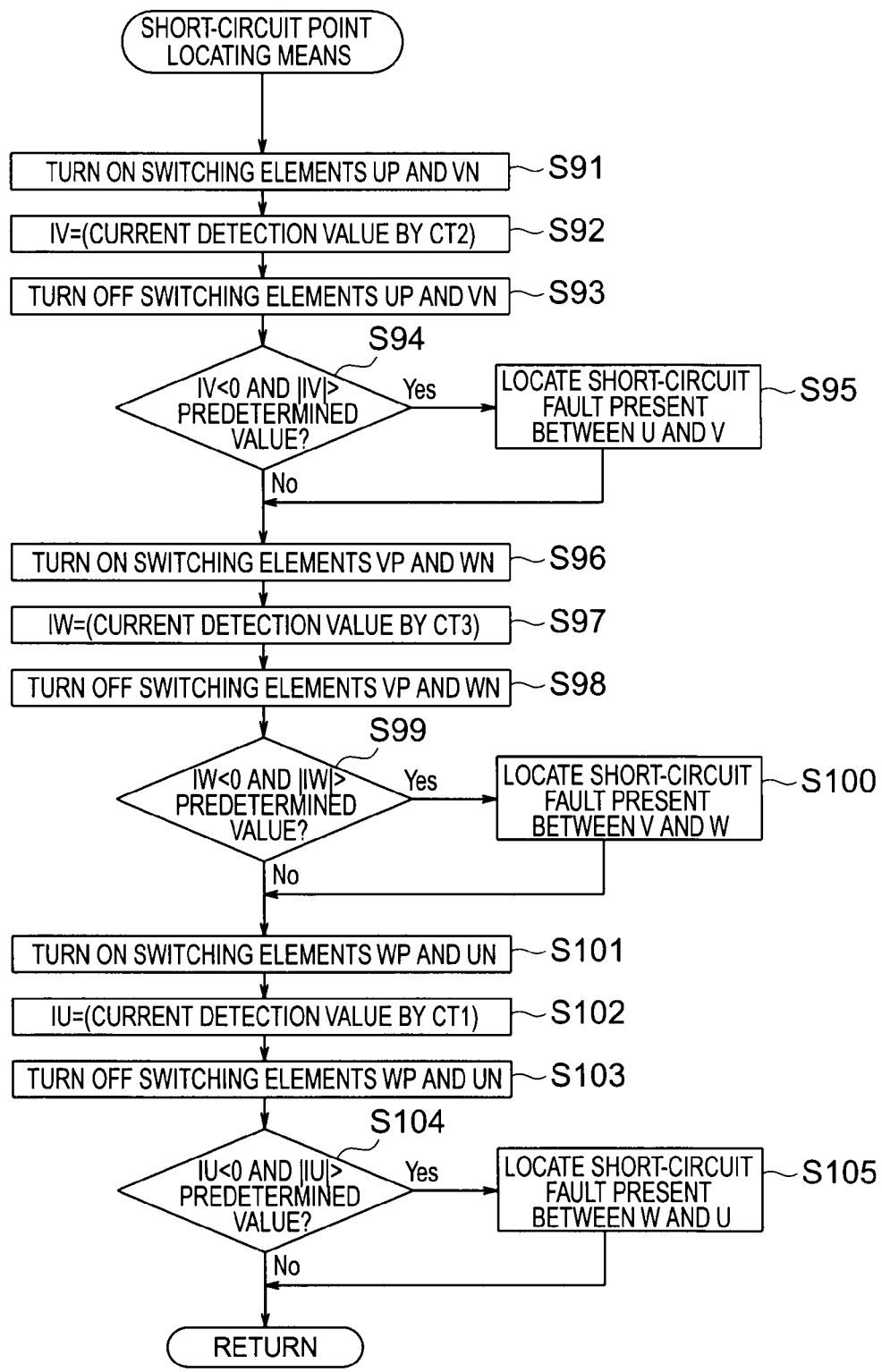
FIG. 13 is a flowchart illustrating operation contents of the short-circuit point locating means according to a third embodiment of the present invention.

For the short-circuit fault between two phases, in order to locate a short-circuit fault point, an operation of the short-circuit point locating means 28 according to a flowchart illustrated in FIG. 13 may be inserted on a prior stage of Step S14 of the flowchart illustrated in, for example, FIG. 2 or FIG. 7 according to the above-mentioned first or second embodiment. The operation of the short-circuit point locating means 28 illustrated in FIG. 13 is similar to the operation of FIG. 5 or FIG. 6, but the operation of FIG. 13 is different in contents of each processing, such as the combinations of switching elements to be turned on and the detection current values used for the determination.

Specifically, for a possible short circuit between the U and V phases, the switching elements UP and VN are turned on at the same time, a response thereto is detected by the V-phase current detector CT2, and, according to whether or not an over current is present, a short circuit between the U and V phases is determined (Step S91 to Step S95). When a short-circuit fault occurs between the U and V phases, and when the switching elements UP and VN are turned on at the same time, a closed circuit routing from the power supply 4, via the UP, the short-circuit fault point, the VP, and the CT2, back to the power supply is formed, and an over current flows through the CT2. Thus, the procedure from Steps S91 to S95 is to be understood.

Similarly to the short-circuit fault between the U and V phases, for a short-circuit fault between the V and W phases and between the W and U phases, it is understood that procedures described in Steps S96 to S100 and Steps S101 to S105 can respectively locate a short-circuit point between phases.

Moreover, in order to avoid a false determination of a short-circuit fault point due to a current generated by a counter-electromotive force, similarly to the method described in the second embodiment, the conditions according to the motor rotation angle and the motor rotational angular velocity may be added. This is realized by inserting the procedure described in Step S60 to Step S62 of FIG. 11 respectively before Step S91, Step S96, and Step S101 of FIG. 13. It should be noted that the angle ranges in the angle condition steps S61 and S62 need to be set to values appropriate to the inter-phase short circuit. As illustrated in FIG. 9 and FIG. 10, for the inter-phase short circuit, the angle ranges may be set considering currents possibly generated by a counter-electromotive force.

The short-circuit point locating means 28 according to this third embodiment stores test patterns illustrated in FIG. 14 as a plurality of combinations for turning on the switching elements, namely test patterns. According to the first embodiment, the test patterns are used for locating a short-circuit point of a short-circuit fault of a switching element or a short circuit to power or ground of motor wiring, and, as in the test patterns illustrated in FIG. 3 and FIG. 4, are patterns for turning on one switching element at a time. For the switch test for locating an inter-phase short-circuit point according to this third embodiment, as illustrated in FIG. 14, one upper switching element and one lower switching element, which is different in phase, are in combination turned on at the same time.

Figure 5:
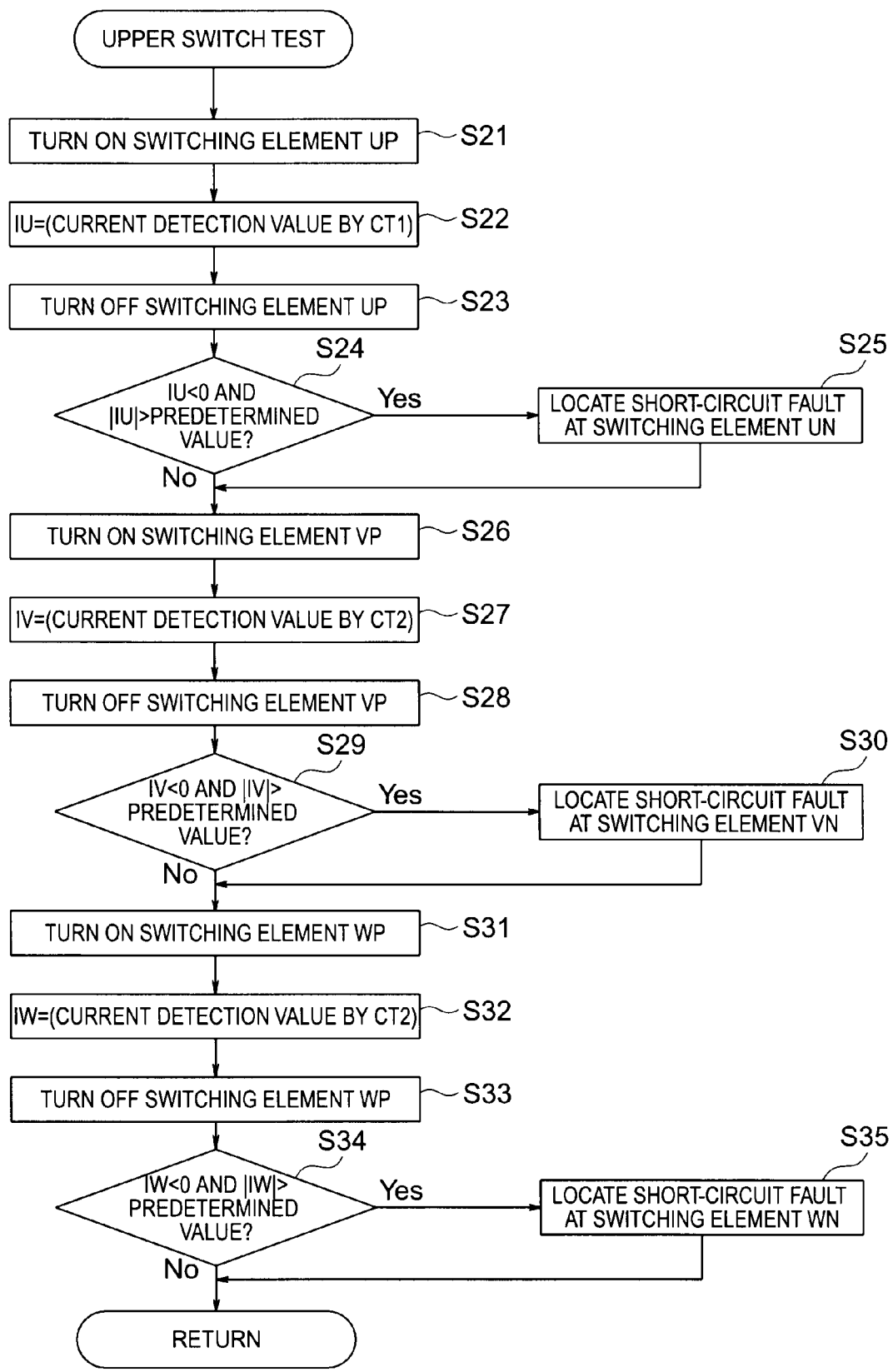
FIG. 5 is a flowchart illustrating contents of an upper switch test of FIG. 2.

In other words, the test patterns according to the first embodiment, as illustrated in FIG. 11, relate to the locating operation for a short-circuit point intended for a short-circuit fault of a lower switching element or a short circuit to ground of motor wiring, and correspond to Step S21, Step S26, and Step S31 of FIG. 5, or, as illustrated in FIG. 12, relate to the locating operation for a short-circuit point intended for a short-circuit fault of an upper switching element or a short circuit to power of motor wiring, and correspond to Step S41, Step S46, and Step S51 of FIG. 6. On the other hand, according to this third embodiment, the test patterns stored by the short-circuit point locating means 28 relate to, as illustrated in FIG. 14, the locating operation for a short-circuit point intended for a short-circuit fault between two phases, and correspond to Step S91, Step S96, and Step S101 of FIG. 13.

According to this third embodiment, in addition to a switching element under a short-circuit fault or a short-circuit point to power or ground of motor wiring, a short-circuit fault point between two phases can be located without outputting an undesirable motor torque, and a period required for locating the short-circuit point can be reduced. Moreover, a current is not detected at the DC section connected to the power supply but is detected for the respective phases, and the current paths are grasped in detail, thereby locating a short-circuit fault point. Hence, the locating operation can be accurate. Moreover, the conditions based on the motor rotation angle and the motor rotational angular velocity are added. Hence, even when the motor is rotating, there is no fear that a false determination is made due to influence of a current generated by a counter-electromotive force, and the short-circuit fault point can be accurately located. Further, it is not necessary to wait until the motor rotation becomes slow, and hence the period required for the locating operation can be reduced.

Moreover, in the above-mentioned embodiments, the case in which the current detection is carried out for the respective phases has been described, and the method of adding the conditions according to the motor rotation angle and the motor rotational angular velocity illustrated in FIG. 11 as the method for avoiding a false determination caused by a counter-electromotive force is also effective for the case in which a current is detected only in the DC section connected to the power supply. This is because, though currents are not detected for the respective phases and this case is thus inferior in accuracy, restrictively for a motor rotation angle and a motor rotational angular velocity for which a current is not generated by a counter-electromotive force, the short-circuit point locating operation can be carried out. Thus, even for the case in which the current is detected only in the DC section connected to the power supply, there is no fear that a false determination is made due to influence of a current generated by a counter-electromotive force, the short-circuit fault point can thus be accurately located, and it is not necessary to wait until the motor rotation becomes slow. Hence, the period required for the locating operation can be reduced.

Fourth Embodiment

Figure 15:
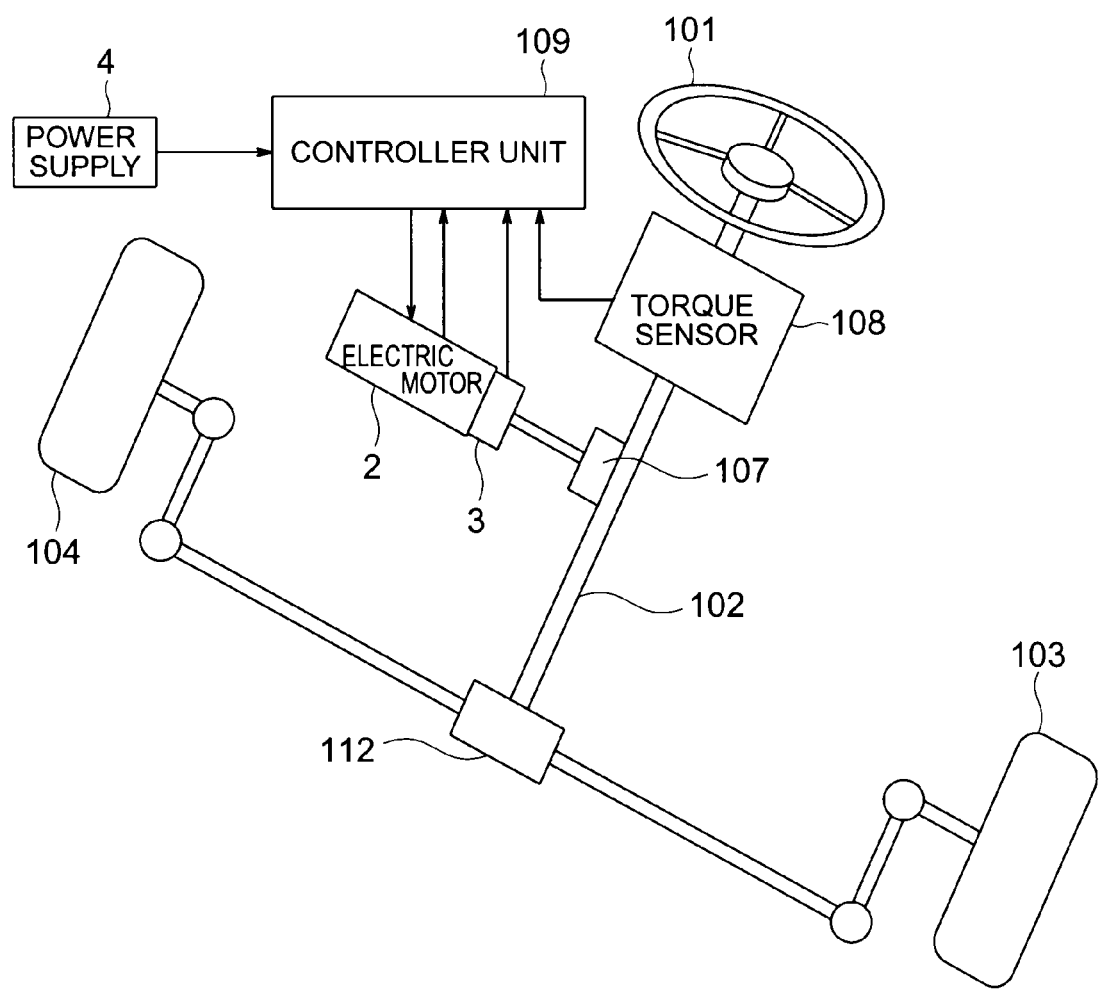
FIG. 15 is a schematic configuration diagram of an electric power steering apparatus according to a fourth embodiment of the present invention.

FIG. 15 illustrates a fourth embodiment of the present invention, and illustrates an example in which the electric motor control apparatus according to the above-mentioned embodiments is applied to an electric power steering apparatus of a motor vehicle.

In FIG. 15, a steering force applied by a driver (not shown) to a steering wheel 101 is transmitted through a steering shaft 102 and a rack and pinion gear 112 to a rack, thereby steering wheels 103 and 104. A brushless motor 2 (referred to as motor hereinafter) including windings for three phases which are U, V, and W phases is coupled to the steering shaft 102 through an intermediation of a motor reduction gear 107. A motor torque (also referred to as assisting force hereinafter) generated by the motor is transmitted via the motor reduction gear 107 to the steering shaft 102, thereby reducing the steering force applied by the driver during the steering.

A torque sensor 108 detects the steering force applied to the steering shaft 102 by the steering of the steering wheel 101 by the driver. A controller unit 109 determines the direction and the magnitude of the assisting force applied by the motor 2 according to the steering force detected by the torque sensor 108, and controls, in order to generate this assisting force, currents flowing from a power supply 11 to the motor. It should be noted that reference numeral 3 denotes a motor angle sensor for detecting a rotation angle of the motor.

The controller unit 9 is constituted by a map (not shown) for calculating a torque current command (also referred to as q-axis current command) corresponding to a target value of the motor torque, and the electric motor control apparatus 1. The map which stores in advance the motor torque to be output determines the direction and the magnitude of the motor torque according to the steering force detected by the torque sensor 108, and calculates the torque current command. Currents are to be caused to flow to the respective phases of the motor 2. The electric motor control apparatus 1 controls, in order to realize the torque current command, the currents flowing through the motor. Those currents generate the assisting force by the motor. This electric motor control apparatus 1 is, for example, the electric motor control apparatus 1 according to any one of the first to third embodiments.

When an abnormality occurs in the electric power steering apparatus during traveling, and the control is thus stopped, the driver feels strong sense of discomfort, and it is thus necessary to continue the control as long as possible. In order to continue the appropriate control as long as possible even when a certain abnormality is present, it is desirable to locate a point of fault. Further, in order to transition to control for handling the abnormal state quickly after the occurrence of the abnormality, it is desirable to locate a fault point in a short period. Moreover, in the electric power steering apparatus, it is desirable to locate a fault point during the steering by the driver, namely during the rotation of the motor.

With the electric power steering apparatus according to this fourth embodiment, a short-circuit fault point can be located accurately in a very short period, and hence quick transition without any error to the control for handling the abnormal state is enabled, thereby reducing the sense of discomfort felt by the driver.

Moreover, when the operation to locate a fault point is carried out, there is no fear to generate an undesirable motor torque, and hence it is possible to reduce the sense of discomfort felt by the driver.

The invention claimed is:

1. An electric motor control apparatus, comprising:
an inverter which comprises a plurality of switching elements, and drives an electric motor by operating the plurality of switching elements;
a current detector disposed in the inverter;
short-circuit point locating means for locating a short-circuit fault point; and
motor rotation angle detecting means for detecting a rotation angle of the electric motor, and outputting a rotation angle detection value,
wherein the short-circuit point locating means stores a test pattern indicative of a combination for turning on the switching elements, and locates the short-circuit fault point based on the test pattern, a current detection value detected by the current detector in response to the test pattern, and the rotation angle detection value, the short-circuit point locating means testing a first subset of the plurality of switching elements if an average motor voltage exceeds a threshold, and tests a second subset of the plurality of switching elements if the average motor voltage does not exceed the threshold.

2. An electric motor control apparatus according to claim 1, wherein the electric motor is an electric motor provided in an electric power steering apparatus.

3. An electric motor control apparatus, comprising:

an inverter which comprises a plurality of switching elements, and drives an electric motor by operating the plurality of switching elements;

a current detector disposed in the inverter;

short-circuit point locating means for locating a short-circuit fault point; and motor rotation angle detecting means for detecting a rotation angle of the electric motor, and outputting a rotation angle detection value, wherein the short-circuit point locating means stores a test pattern indicative of a combination for turning on the switching elements, and locates the short-circuit fault point based on the test pattern, a current detection value detected by the current detector in response to the test pattern, the rotation angle detection value, and a rotational angular velocity obtained by differentiating the rotation angle detection value, and the short-circuit point locating means only testing the switching elements when an absolute value of the rotation angular velocity is less than a threshold value or when the rotation angle detection value is within a predetermined angle range.

4. An electric motor control apparatus according to claim 3, wherein the electric motor is an electric motor provided in an electric power steering apparatus.

5. An electric motor control apparatus, comprising:

an inverter which comprises a plurality of switching elements, and drives an electric motor by operating the plurality of switching elements;

a current detector disposed in the inverter;

short-circuit point locating means for locating a short-circuit fault point; and terminal voltage detecting means for detecting a terminal voltage of the electric motor, wherein the short-circuit point locating means stores a test pattern indicative of a combination for turning on the switching elements, selects a test pattern to be carried out according to a result of comparison between a detection value of the terminal voltage detecting means and a predetermined threshold, and locates the short-circuit fault point based on the test pattern and a current detection value detected by the current detector in response to the test pattern, the short-circuit point locating means testing a first subset of the plurality of switching elements if an average motor voltage exceeds a threshold, and tests a second subset of the plurality of switching elements if the average motor voltage does not exceed the threshold.

6. An electric motor control apparatus according to claim 5, wherein the electric motor is an electric motor provided in an electric power steering apparatus.

* * * * *